United States Patent [19]

Wu et al.

[11] Patent Number: 6,071,658

[45] Date of Patent: Jun. 6, 2000

[54] PROXIMITY EFFECT CORRECTION METHOD FOR MASK PRODUCTION

[75] Inventors: H. J. Wu; Shyi-Long Shy, both of Hsinchu, Taiwan

[73] Assignee: United Microelectronics Corp., Hsin-Chu, Taiwan

[21] Appl. No.: 09/024,911

[22] Filed: Feb. 17, 1998

[30] Foreign Application Priority Data

Dec. 31, 1997 [TW] Taiwan ................... 86120044

[51] Int. Cl.$^7$ ................ G03F 9/00; G03C 5/00
[52] U.S. Cl. ........................... 430/30; 430/296
[58] Field of Search ..................... 430/30, 296

[56] References Cited

U.S. PATENT DOCUMENTS 5,736,281  4/1998  Watson ........................ 430/30

*Primary Examiner*—Christopher G. Young

[57] ABSTRACT

A proximity effect correction method for mask production by integrating the electron beam proximity effect correction method and the optical proximity effect correction method such that the problems of having too large a computer-aided design pattern data file during mask production and using the mask to transfer the image to the wafer by a stepper is solved. The correction method of this invention comprises the steps of providing a pattern for forming on a mask, and then dividing the mask area into a plurality of first area patches and a plurality of second area patches, wherein each first area patch contains part of the whole pattern while each second area patch does not contain any pattern. Next, according to pattern density and light contrast, the amount of exposure by electron beam is adjusted such that electron beam proximity effect and optical proximity effect are corrected forming a corrected pattern. Finally, using the corrected pattern, an electron beam exposure operation is carried out to form the mask.

1 Claim, 2 Drawing Sheets

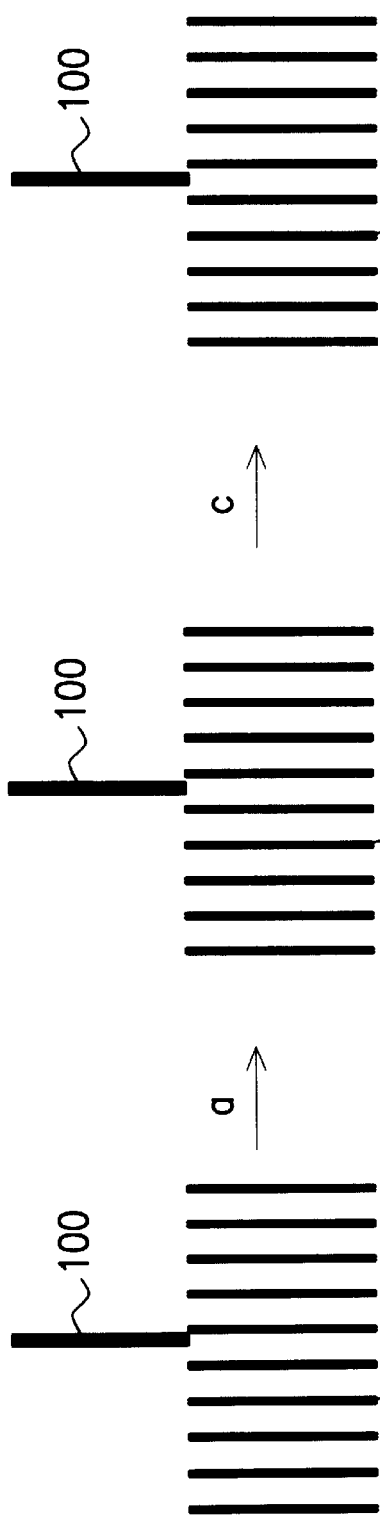
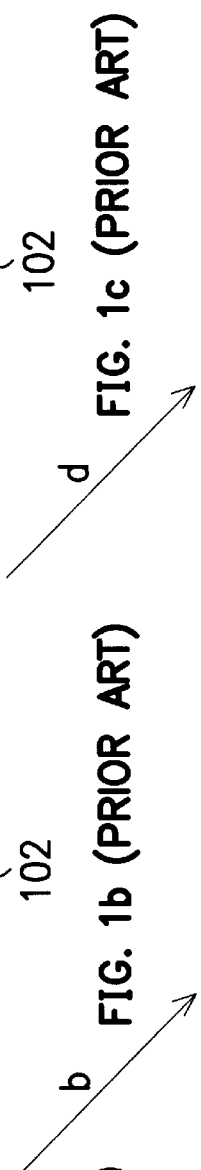
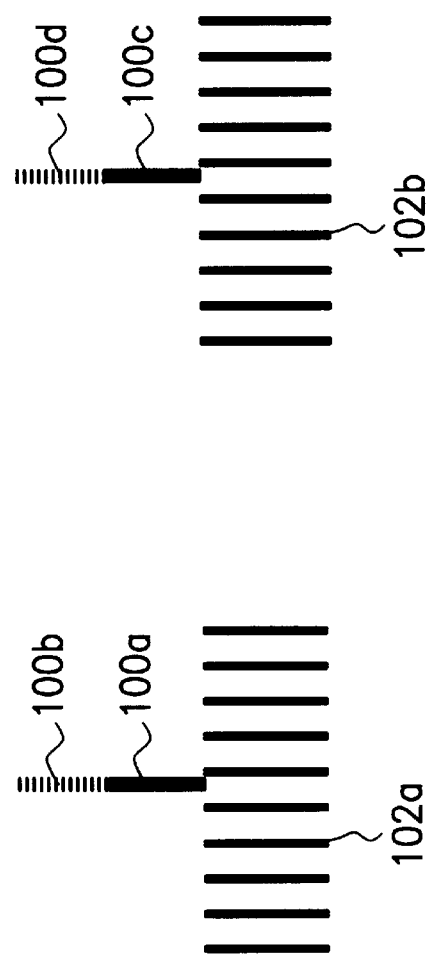
FIG. 1a (PRIOR ART)
FIG. 1b (PRIOR ART)
FIG. 1c (PRIOR ART)
FIG. 1d (PRIOR ART)
FIG. 1e (PRIOR ART)

PROXIMITY EFFECT CORRECTION METHOD FOR MASK PRODUCTION

CROSS-REFERENCE TO RELATED APPLICATION

This application claims the priority benefit of Taiwan application serial no. 86120044, filed Dec. 31, 1997, the full disclosure of which is incorporated herein by reference.

BACKGROUND OF THE INVENTION

1. Field of Invention

The present invention relates to a proximity effect correction method for fabricating a mask. More particularly, the present invention relates to a quantum proximity effect correction (QPEC) method that integrates electron beam proximity effect correction method and the optical proximity effect correction method in the fabrication of a mask.

2. Description of Related Art

Following the recent progress in integrated circuit fabricating techniques, line resolution finer than 0.25 μm becomes quite common. As demands for speed and quality of semiconductor devices continue to escalate, technologists in the semiconductor industry are striving towards improved methods for solving problems caused by a low resolution. Photolithographic processing is a major step in the fabrication of semiconductor. In photolithographic processing, a defined pattern is transferred to a silicon wafer. The process of transferring the pattern to the silicon wafer comprises the steps of providing a mask having a defined pattern in it. Then, through exposure to light and subsequent development, the pattern in the mask is transferred to a photoresist layer over a wafer. Thereafter, the photoresist layer is used as a mask for etching the layer or layers below.

Since the mask is a critical component for carrying out the transfer of circuit patterns to the wafer, it must be carefully prepared each time before patterning the photoresist layer through light exposure. If a mistake is made in the fabrication of the mask, most probably the whole batch of wafers may have to be scrapped. Therefore, in order to speed up the fabrication process and minimize errors, most equipment and processes in integrated circuit manufacturing is under computer control.

Because an electron beam photolithographic technique can have a maximum resolution of about 0.375±0.05 μm while an optical laser photolithographic technique can have a resolution at most around 1±0.3 μm, most integrated circuit photo mask production that fabricates masks with feature line smaller than about 0.25 μm all use the electron beam photolithographic technique to carry out exposure. Although the resolution in using an electron beam photolithographic technique is considerably higher, scattering often occurs when a pattern is defined. Hence, ultimate resolution and line width is difficult to control. The scattering of electron beam limits the ultimate resolution of the line width, and this phenomenon is known as proximity effect. This proximity effect can be corrected by using an electron beam proximity effect correction method. The electron beam proximity effect correction method can be used to correct proximity effect problem in the mask when the mask tooling operation is carried out. However, although the mask is corrected for its proximity effect by the electron beam proximity effect correction method during mask tooling operation, problems arising out of optical proximity effect still need to be solve due to the application of a stepper machine to project the image from the mask onto the wafer.

When light is shone by a stepper machine through a mask onto a wafer, optical proximity effect will occur due to the diffraction and interference of light. Hence, an optical proximity effect correction method must be used to correct the image. However, using softwares to correct the stepper machine often requires a large computer-aided design (CAD) image data files, and so precise pattern transfer is difficult to achieved.

At present, most integrated circuit factories apply the electron beam proximity effect correction method on mask tooling and using corrected electron beam pattern data files for performing mask tooling. Thereafter, an optical proximity effect correction method is used to correct the corrected electron beam pattern data files before performing mask tooling for exposure by the stepper. However, the use of these two methods repeatedly to correct the image not only will distort the pattern, but will also create a large data file for storing the pattern. For example, FIGS. 1a through 1e are a series of diagrams showing the defective transfer of pattern by a conventional photolithographic processing.

In FIG. 1a, a desired pattern for putting on the mask is shown. For illustration purposes, the pattern includes a long line 100 at top and a grid gate pattern 102 below. First, the CAD image file data are transmitted to the mask. As shown in step (a), if an electron beam proximity effect correction method is used to correct the image, the result is that the whole pattern defined in the CAD image data is transferred to the mask intact as shown in FIG. 1b. On the other hand, if step (b) is chosen where no electron beam proximity effect correction is applied, the final image is distorted as shown in FIG. 1c. In other words, when the pattern defined in the CAD image data is transferred to the mask, problems such as gross pattern distortion, broken lines and shrinkage often arise. As illustrated in FIG. 1c, the long line 100 as originally defined in the pattern is transformed into two parts, namely, a broken and shorter line 100a and a disappearing top line 100b, while the grid gate as originally defined in the pattern will turn into a shrunk grid gate pattern 102a.

When the defined pattern on the mask is again transferred to the wafer by shining light through a mask using a stepper, optical proximity effect problem is encountered. Step (c) shows the effect of using an optical proximity effect correction method to correct the image during light exposure of wafer. The defined pattern on the mask is transferred to the wafer surface as shown in FIG. 1d. Alternatively, if no optical proximity effect correction method is used as in step (d), the final pattern is as shown in FIG. 1e. The transferred pattern from the defined pattern on the mask will be distorted. In other words, when the pattern defined on the mask is transferred to the wafer, problems such as gross pattern distortion, broken lines and shrinkage often arise. As shown in FIG. 1e, a long line 100 as originally defined in the pattern is transformed into two parts, namely, a broken and shorter line 100c and a disappearing top line 100d, while the grid gate as originally defined in the pattern will turn into a shrunk grid gate pattern 102b. Consequently, both the electron beam proximity effect correction method and the optical proximity effect correction method must be used together in photolithographic processing operation.

However, using optical proximity effect correction method to correct the exposure by a stepper and correcting the defined pattern on the mask at the same time needs a large amount of memory to store the pattern in a CAD data file. Furthermore, the mask also needs to perform a subsequent electron beam proximity effect correction process to correct the mask tooling of electron beam. Because of repeated corrections, the image pattern will be distorted.

Moreover, a very large image data file needs to be kept and the time necessary to bring about the correction is long.

In light of the foregoing, there is a need to improve the proximity effect correction method for a mask.

SUMMARY OF THE INVENTION

Accordingly, the present invention is to provide a quantum proximity effect correction method for integrating electron beam and optical proximity effect correction methods in order to solve the proximity problems in the process of transferring integrated circuit pattern from computer-aided design data file to mask production and from mask to forming a pattern on the wafer by exposure using a stepper.

To achieve these and other advantages and in accordance with the purpose of the invention, as embodied and broadly described herein, the invention provides a proximity effect correction method for mask production by integrating the electron beam proximity effect correction method and the optical proximity effect correction method such that the problem of having too large a computer-aided design pattern data file during the fabrication of a mask and later using the mask to transfer the image to the wafer by a stepper is solved. The correction method comprises the steps of providing a desired pattern for transferring to a mask, and then dividing up the mask area into a plurality of first area patches and a plurality of second area patches, wherein each first area patch contains part of the whole pattern while each second area patch does not contain any pattern. Next, according to pattern density and light contrast, the amount of electron beam exposure is adjusted such that electron beam proximity effect and optical proximity effect are corrected to obtain a corrected pattern. Finally, using the corrected pattern, a correct electron beam exposure is carried out to form the mask.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings, FIGS. 1a through 1e are a series of diagrams showing the defective transfer of pattern by a conventional photolithographic processing.

DESCRIPTION OF THE PREFERRED EMBODIMENTS

Figure 2B:
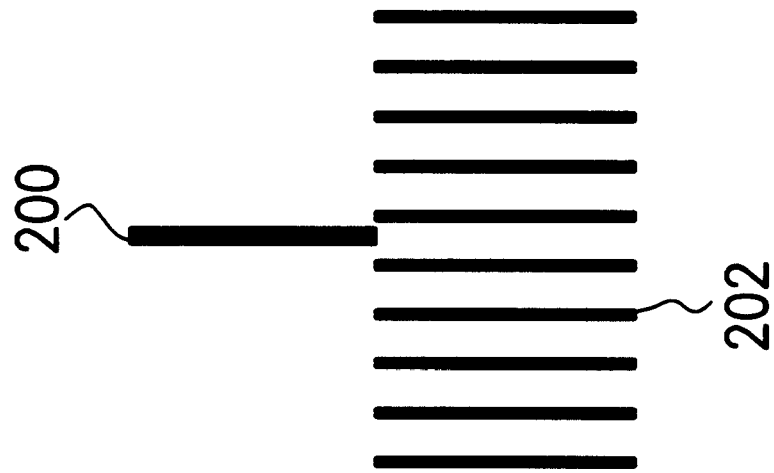
FIGS. 2a and 2b are diagrams showing the use of proximity effect correction method for the production of mask according to one preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

Figure 2A:
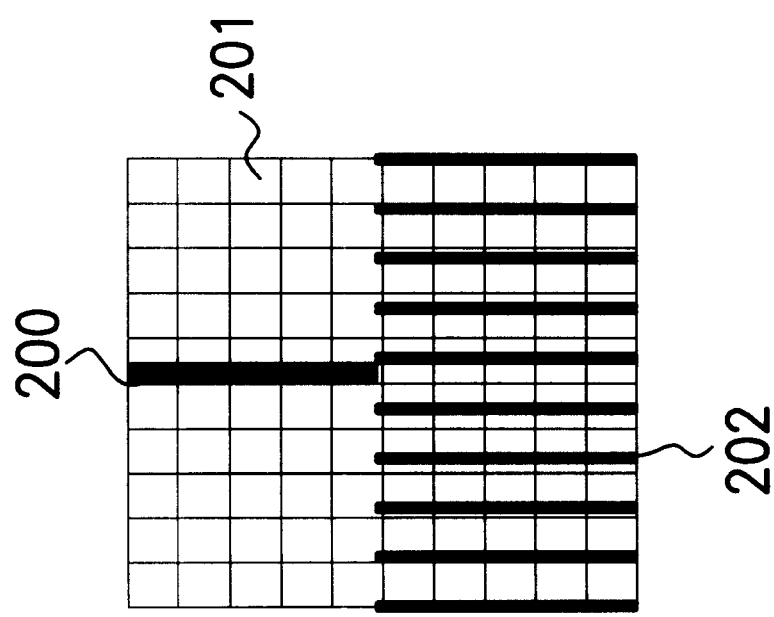

This invention provides a proximity effect correction method for mask by integrating the electron beam proximity effect correction method and the optical proximity effect correction method such that the problem of having too large a computer-aided design pattern data file during the production of a mask and using the mask to transfer the image to the wafer by a stepper is solved. The method is to divide the defined pattern into a plurality of area patches whose sizes and forms do not depend upon the shape of the pattern. FIGS. 2a and 2b are diagrams showing the use of proximity effect correction method for the production of mask according to one preferred embodiment of this invention.

First, as shown in FIG. 2a, a computer-aided design pattern data file for forming a pattern on the mask is provided. The pattern includes a line 200 and a grid gate pattern 202 in it. However, the patterns need not be restricted as such, the pattern shown in FIG. 2a are for illustration only. Next, according to the pattern provided, the mask is divided into a plurality of area patches 201 including a plurality of first area patches and a plurality of second area patches, wherein the first area patches contain part of the pattern, whereas the second area patches do not have any pattern in it. Density of the pattern car vary from about 0% to 100% and light contrast also can vary from about 0% to 100%, wherein 0% refers to the complete absorption of light and 100% refers to the complete reflection of light. The shape of each area patch is not restricted. However, according to the preferred embodiment of this invention, a square having equal sides known as a unit address is selected for illustration purposes. After forming the area patches 201, a computing step is performed considering pattern and light contrast. Using each of these unit addresses as a basic unit, the amount of exposure by electron beam within each basic unit is adjusted according to the pattern density and its contrast, and then developed to produce the mask. Pattern density is related to the electron beam proximity effect, and the light contrast is related to the optical proximity effect. Using the quantum proximity effect correction method of this invention, problems caused by optical proximity effect correction method and the electron beam proximity effect correction method can be resolved. As shown in FIG. 2b, the pattern transferred from the originally defined pattern to the mask after going through step (e) is a replica without any distortion, broken line or shrinkage problems. Thereafter, subsequent photolithographic processing using conventional technique is performed, so detail description is omitted here.

The proximity effect correction method used in this invention is known as a quantum proximity effect correction method. The advantages of using this method compared to a conventional one includes:

(1) The mask pattern in the computer-aided design data file is divided up into several area patches, and the proximity correction is carried out for each area patch or individual unit rather than as a single large patch in conventional technique; and (2) Electron beam proximity effect correction method and optical proximity effect correction method are integrated together, there is no need for repetitive corrections and so data files for storing the pattern is smaller.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A proximity effect correction method for mask production, comprising the steps of:

providing a pattern for forming over a mask;

dividing the mask into a plurality of first area patches having a predetermined area and a plurality of second area patches with a predetermined area, wherein the first area patches contain part of the whole pattern and the second area patches do not contain any pattern;

after forming said first and second area patches, computing the necessary light intensity of an electron beam from pattern density and light contrast data in each first area patch and light contrast data in each second area patch for correcting the electron beam proximity effect and the optical proximity effect thereby forming a corrected pattern; and performing an electron beam exposure operation using the corrected pattern to form the mask.

* * * * *